US006909614B2

(12) United States Patent
Beihoff et al.

(10) Patent No.: US 6,909,614 B2
(45) Date of Patent: Jun. 21, 2005

(54) POWER BACKPLANE FOR POWER ELECTRONIC DEVICES

(75) Inventors: Bruce C. Beihoff, Stevensville, MI (US); Dennis L. Kehl, Benton Harbor, MI (US); Timothy A. Roebke, Milwaukee, WI (US); Lee A. Gettelfinger, Brown Deer, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 6 days.

(21) Appl. No.: 10/675,749

(22) Filed: Sep. 30, 2003

(65) Prior Publication Data

US 2005/0068755 A1 Mar. 31, 2005

(51) Int. Cl.[7] .............................................. H01R 12/16

(52) U.S. Cl. ....................... 361/788; 361/728; 361/803

(58) Field of Search ................................ 361/728–730, 361/788, 803, 822–829; 439/61, 65, 540.1

(56) References Cited

U.S. PATENT DOCUMENTS

| | | | | |
|---|---|---|---|---|
| 5,381,314 A | * | 1/1995 | Rudy et al. ................. | 361/712 |
| 5,748,451 A | * | 5/1998 | Thompson et al. ......... | 361/788 |
| 5,980,312 A | * | 11/1999 | Chapman et al. ......... | 439/540.1 |
| 6,243,273 B1 | * | 6/2001 | Beun et al. ................. | 361/796 |

* cited by examiner

Primary Examiner—Kamand Cuneo
Assistant Examiner—Tuan Dinh
(74) Attorney, Agent, or Firm—Manish B. Vyas; William R. Walbrun (57) ABSTRACT

A multi-layer power backplane system is disclosed for use with various power electronic and other systems. The power backplane includes multiple mechanical, conductor and isolation layers which serve to route power to and from various components. The layers are isolated from one another by support/isolation panels which may receive conductors used to route power. Data signals may also be routed through the system. The system accommodates fluid cooling of the electronic components by an additional layer of conduit support and isolation. The overall system provides a high degree of flexibility and modularity in defining a power backplane for a wide range of circuitry and components which may be mounted thereto once the power backplane is designed and assembled.

35 Claims, 9 Drawing Sheets

POWER BACKPLANE FOR POWER ELECTRONIC DEVICES

BACKGROUND OF THE INVENTION

The present invention relates generally to the field of power electronic devices, and particularly to a novel technique for providing power to and from such devices in a modular package, and for providing cooling to the components, where desired.

A wide variety of applications exist for power electronic circuits, such as switching devices and systems. In such systems, multiple components may be combined and interconnected for a wide range of functionality. For example, in traditional switchgear applications, an enclosure is generally provided into which power is routed, along with network signals, sensor inputs, actuator outputs, and so forth. Components within the enclosure are interconnected with external circuitry, and can be interconnected with one another to provide for control, monitoring, circuit protection, and a multitude of other functions. Such conventional approaches, however, require a substantial number of terminations of various conductors, routing of conductors, mounting of various components, and so forth.

In other types of packaging, components may be associated with one another in mounting areas or bays, which are electrically coupled to buses for routing power to the various components. Examples of this type of packaging may be found in conventional motor control centers, in which various control, monitoring and protective circuits are mounted and interconnected with one another via wiring harnesses, cables, and so forth. In other applications, particularly where power levels are much lower, it has become conventional to provide a "backplane" to which components may be coupled, such as via plug-in connections. Such backplanes are currently in use throughout industrial applications, as for providing data and control signals to and from programmable logic controllers, computer components and peripherals, and so forth. The use of such backplanes, through which data and control signals can be easily routed, presents substantial advantages from the point of view of ease of assembly, replacement, servicing and expansion of overall systems incorporating a large number of interfaced components.

Despite the considerable convenience of backplane approaches to component interfacing, very limited use of such technologies has been made in power applications. In general, power applications may be considered to include those applications where higher power ratings are provided, typically either a single or three-phase ac power, to drive electrical loads. As will be appreciated by those skilled in the art, circuitry designed for such power applications typically differs substantially from circuitry for data applications. The power ratings, electrical characteristics, and thermal characteristics of power electronic circuits are particularly demanding, from many points of view. For example, due to higher voltage and current ratings, routing of conductors must meet stringent industry standards and codes. Dissipation of thermal energy in such settings is always an issue, particularly where package sizes become reduced due to space, weight and similar constraints. Certain circuits are currently cooled by fluids, including by liquid cooling media, which adds a further dimension to the complexity of mounting and routing of electrical conductors and fluid conduits.

Current interconnection arrangements for most power electronic circuits, like those for large motor drives, do not use backplane topologies. Rather, power is routed into, throughout and out of enclosures based upon the locations of the components. Coolant, if used, is similarly routed. Consequentially, it is common to see large conductors, insulated and uninsulated, bent into circuitous paths between and among components without much regard for the efficiency of the connections or the use of space. Such approaches are not only challenging to service, but can be quite time consuming to design and fabricate, generally requiring custom bending and installation of the many interconnections and supports.

There continues to be a need for improved techniques for mounting and interfacing power electronic components and products, that offer flexible and cost-effective manufacturing potential in modular packages. There is a particular need for improved designs for mounting and interconnecting power electronic components both electrically and with coolant sources that can be adapted for a wide range of applications and circuit configurations.

SUMMARY OF THE INVENTION

The present technique provides a novel approach to power electronic packaging designed to respond to such needs. The technique significantly advances the art in the use of a backplane concept adapted for power electronic circuitry. The technique may be used for both large and smaller systems, and for interconnecting few or a large number of components in modular packages. The technique is particularly suited to applications in which power electronic switching devices can generate significant amounts of heat that can be extracted via liquid coolant circulated through one or more of the devices. The modular packaging may be adapted very flexibly to accommodate a wide range of circuit and component configurations requiring such interconnections.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
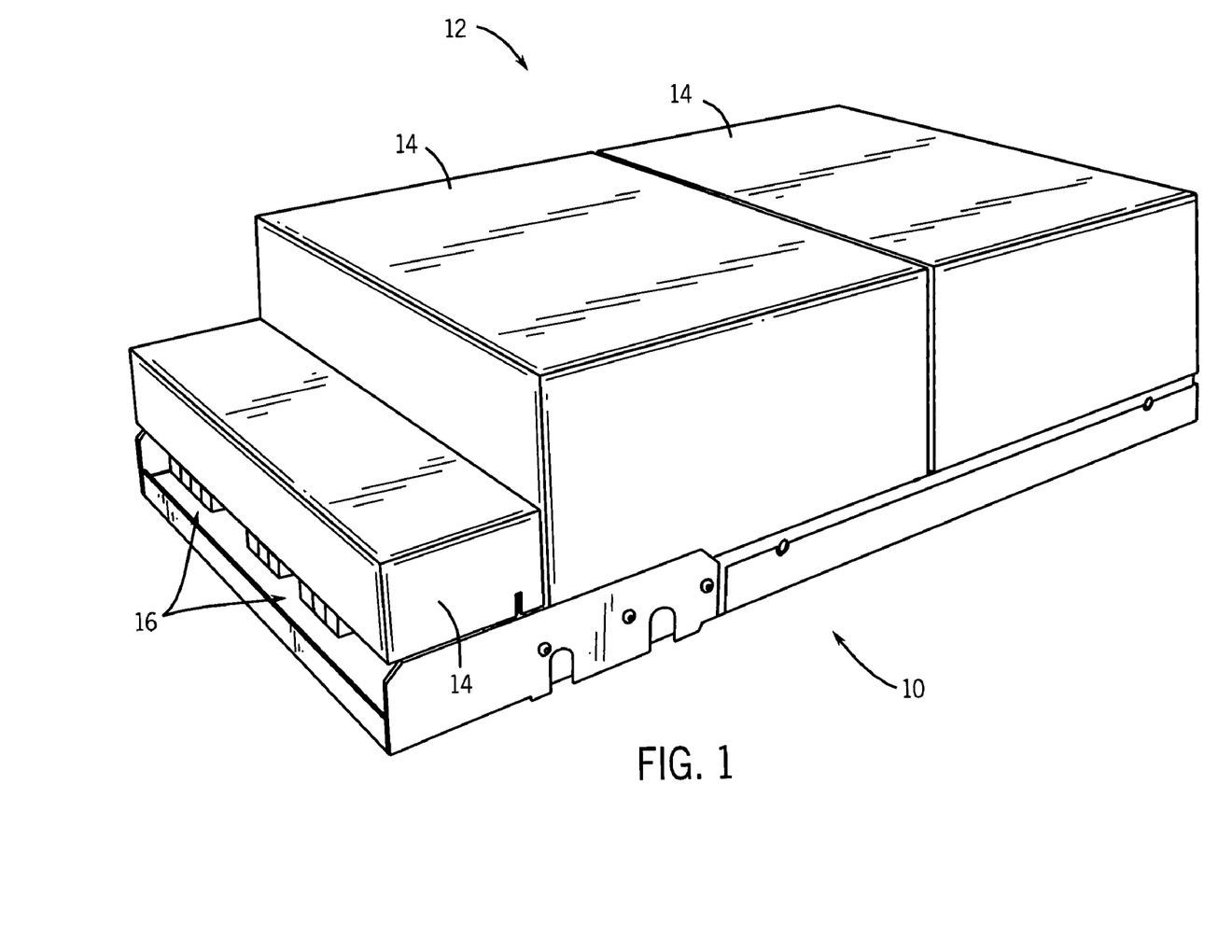
FIG. 1 is a bottom perspective view of a power backplane in accordance with aspects of the present technique as applied to a power electronic system.

Turning now to the drawings, and referring first to FIG. 1, a power backplane system 10 is illustrated as employed with a power electronic system 12. As described more fully below, the power backplane system 10 permits distribution of power, data and coolant to various components of the power electronic system, both for application of power to the devices of the system and for routing power from the devices to external circuitry. In practical applications, the power electronic system 12 may define various types of circuitry, including conventional switchgear of the type traditionally housed in various enclosures. Moreover, the present technique is particularly well-suited to modular systems of a wide range of designs. Presently contemplated power electronic systems on which the backplane technique may be employed include inverters, dual inverters, dc/dc converters, converter/inverter systems, various power cells, and so forth. Moreover, various enclosure requirements may be accommodated, including quick disconnect/replacement capabilities, sealed and unsealed units, explosion proof units, waterproof units, "zero cabinet" enclosures, and so forth. Such systems may accommodate ac inputs, dc inputs, ac and/or dc outputs, and multiple input and output voltage and current ratings. Similarly, various communications interfaces may be accommodated such as control area networks, various industry-specific interface circuitry and cards, analog communications devices, as well as proprietary communications circuitry. In presently contemplated embodiments, and as more fully described below, a range of power inputs and outputs may vary widely, including both single-phase and three-phase power with ac rated voltages varying from 110 Volts to 380/460 Volts, and upwards to 1000 Volts and beyond. For certain power electronic devices, liquid cooling will be desired, and such cooling may be accommodated and routed via the power backplane system 10. Where such cooling is not required, the present technique permits configuration of a power backplane in a modular fashion so as to facilitate elimination of the cooling layers and components.

In the embodiment illustrated in FIG. 1, the power backplane system 10 extends over a desired area, but is subdivided into sections as described below. Each section is secured and sealed from one another by an enclosure or cover 14. One or multiple such enclosures may be provided in the power backplane, depending upon the needs of the application. Also as illustrated in FIG. 1, terminals 16 are provided along an edge of the power backplane system 10 to facilitate interconnection of the power backplane, and thereby the components of the system 12, with external circuitry.

Figure 2:
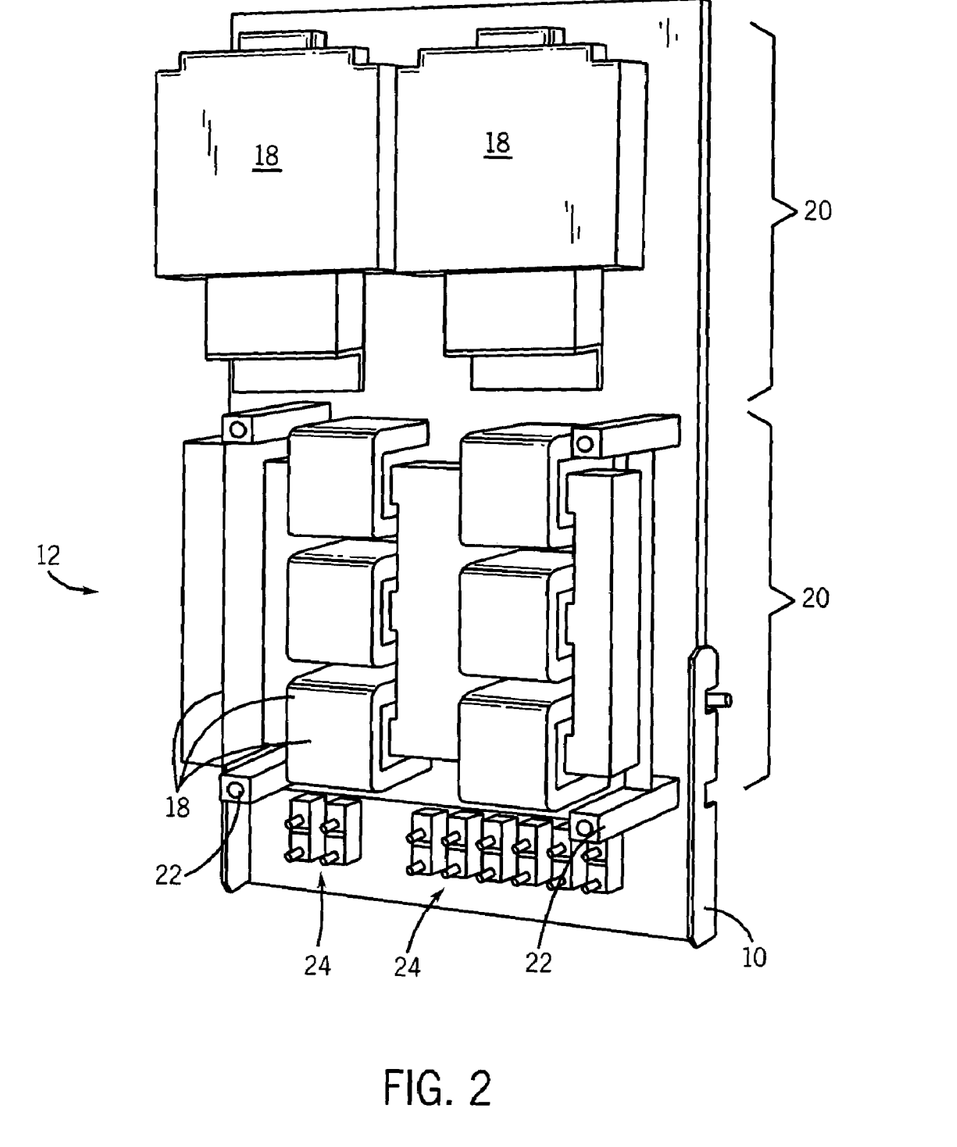
FIG. 2 is a perspective view of the components mounted to the backplane within the system, with enclosures of Figure one being removed to expose the components.

FIG. 2 illustrates the system of FIG. 1 following removal of the enclosures 14. As can be seen, the power electronic system 10 may include a range of components 18 mounted on the power backplane system 10 and interconnected with one another and with external circuitry, as well as with coolant flow, where desired. Details regarding the specific components illustrated in FIG. 2 are not provided herein. However, those skilled in the art will readily recognize that many such components and systems can be accommodated via the present technique, including components defining any of the circuitry discussed generally above, as well as other types of circuits as well.

As noted above, in the illustrated embodiment, the circuitry defining the power electronic system 10 is subdivided into sections 20. The sections are interconnected via the power backplane system 10, but for various reasons may be isolated from one another via the enclosures illustrated in FIG. 1. Such reasons may include voltage ratings, serviceability concerns, electric isolation concerns, and so forth. In the illustrated embodiment, supports or standoffs 22 are provided for both accommodating the components of the power electronic system 12, and for securement of the enclosure or cover over the components and the corresponding portion of the power backplane system 10. As also shown in FIG. 2, the terminals described above may be provided in terminal arrays 24, as to accommodate groups of inputs or outputs, such as three-phase conductors of different power ratings or classes.

Figure 3:
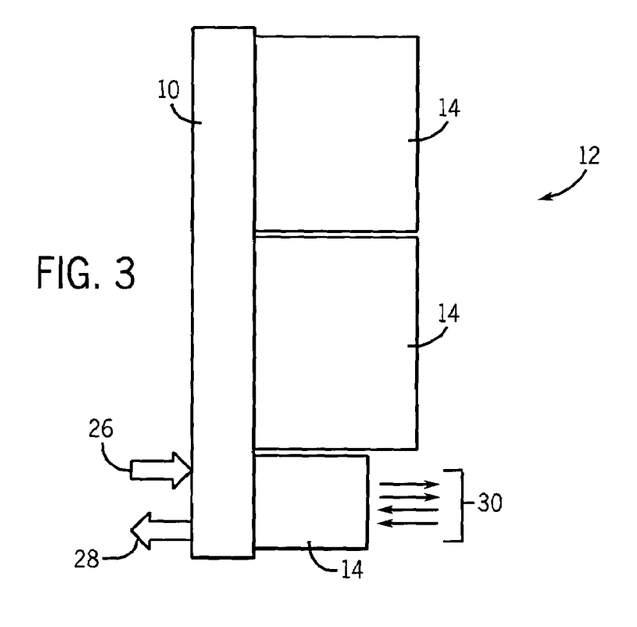
FIG. 3 is a side elevational view of the system of FIG. 1, diagrammatically illustrating the application of coolant and signals to and from the assembly.
Figure 4:
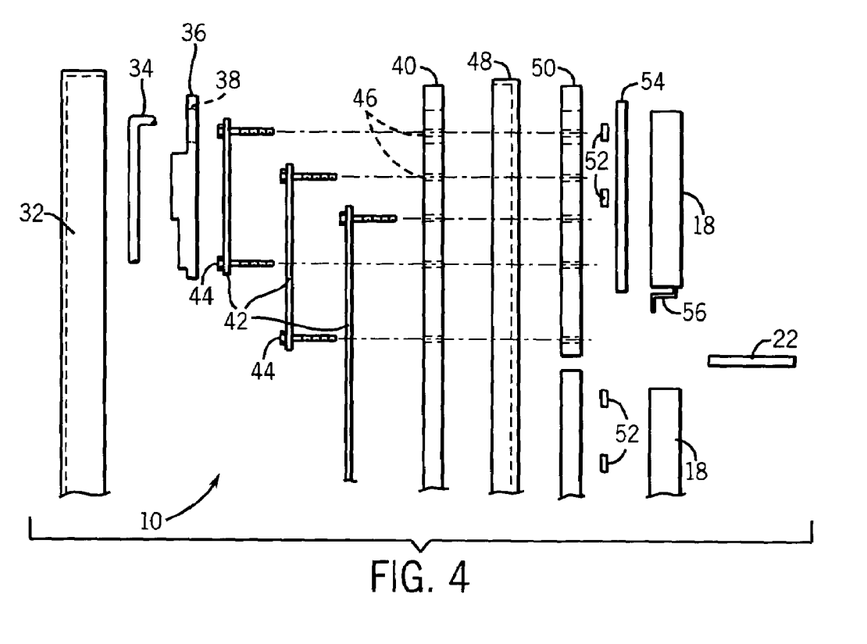
FIG. 4 is a partial elevational view of certain exemplary components that makeup the backplane system of the previous figures shown exploded for exemplary purposes.

FIGS. 3 and 4 illustrate side views of the exemplary embodiment of the power backplane system shown FIGS. 1 and 2. Specifically, FIG. 3 illustrates the subdivision of the overall assembly into the power backplane system 10 and the power electronic system 12, with the enclosures 14 in place. As illustrated diagrammatically in FIG. 3, in the embodiment described herein, the power electronic system 10 includes components which require fluid cooling, supplied by a coolant inlet flow 26 and a coolant outlet flow 28. Similarly, reference numeral 30 indicates generally the interchange of power and data with the power backplane system 10, such as via the terminal arrays illustrated in FIG. 2. It should be noted that, while in the illustrated embodiment it has been convenient to group the inputs and outputs, and the coolant of flow along an edge or sides of the power backplane system 10, such inputs and outputs, and interconnections may be provided at any location in a power backplane system. Thus, where desired, various terminal and connection configurations may be envisaged, as along a single edge, multiple edges, flow-through arrangements, and so forth.

The illustration of FIG. 4 generally shows exemplary portions of the power backplane system 10 in accordance with a present embodiment. Specific implementations of these components are illustrated in the subsequent figures, although for illustrative purposes a number of the components have been illustrated very generally in FIG. 4. In the illustrated power backplane system 10, multiple layers or levels of conduits, conductors, insulators and mechanical supports are provided. In general, the overall system is defined by an assembly of these four types of elements stacked and interconnected with one another to define the desired electrical and fluid interconnections between the components of the power electronic system, and to provide the desired mechanical support and electrical isolation for these components.

As illustrated generally in FIG. 4, and beginning from what may be termed a rear side of the power backplane system 10, a rear support 32 provides a rear enclosure-type panel and mechanical support for various components in the assembled system. In the present embodiment, the rear support 32 is a rigid metallic support. Within the rear support 32, coolant conduits 34 route coolant flow from an inlet to an outlet, and between the various components. It should be generally borne in mind that multiple such circuits may be provided, as to accommodate different coolants, different flow paths, and so forth. Moreover, various fluid circuits may be defined, including manually-operated valves (not shown), open and closed-loop sensor and actuator systems (not shown), and so forth. Similarly, integrated or external reservoirs, coolant pumps, and so forth may be provided at this level, although it may be preferable to provide such circulation equipment as an external system plumbed to the power backplane system.

The coolant conduits 34 are mechanically supported within the power backplane system 10. In the illustrated embodiment, mechanical support is provided by a conduit support/isolation layer 36. While various types of supports and isolation may be envisaged, in the illustrated embodiment, layer 36 provides both mechanical support for the coolant conduits, and electrical isolation of the coolant conduits and any other components behind the layer 36 from conductor layers on an opposite side thereof. Moreover, apertures 38 are provided through the conduit support/isolation layer 36 to allow passage of the conduits 34 therethrough, as well as any fasteners, mechanical brackets, and so forth which may be required for securement of the conduits, or layer 36 within the assembly.

Continuing from the rear to the front side of the power backplane system 10, a rear conductor support/isolation layer 40 provides for mounting and routing of power conductors 42. Layer 40 may be constructed in a similar manner to layer 36, to provide both mechanical support to the conductors 42, as well as isolation between the conductors and between the conductors and other components of the system. Moreover, as described more fully below, conductors 42 may be routed in various configurations and directions, and interconnected with one another so as to route power to locations adjacent to the connection points for the various components to be mounted on the power backplane system. For mechanical securement of the conductors to the rear conductor support/isolation layer 40, and for interconnection of the conductors with one another and the components, fasteners 44 may be provided. Where desired, screwed fasteners, riveted fasteners, or any other attachment system, such as welding, brazing, solder connections, flexible braids, and so forth may be provided. As with layer 36, support/isolation layer 40 includes a series of apertures 46 extending therethrough to accommodate both the passage of any conduits 34 and any fasteners 44 or the conductors 42 themselves. Naturally, certain of the apertures through layer 40 will correspond to locations of apertures 38 through layer 36.

Continuing with the illustrated assembly, a front support 48 is provided to add mechanical support for the various components to be mounted on the power backplane system 10. In a present embodiment, a support 48 is made of a rigid metallic sheet so as to effectively sandwich the conduits, support/isolation layers 36 and 40 and conductors 42 within the power backplane system 10, and to provide mechanical support for the components. It should be noted that, where desired, multiple individual layers may be provided on one or both sides of the front support 48. For example, multiple conductor support/isolation layers 40 may be provided, so as to route multiple layers of conductors, including conductors of various power ratings, conductors extending in various directions, conductors accommodating various terminal locations, and so forth. A single such layer is illustrated in the present embodiment.

On an opposite side of the front support 48 is a series of conductors that serve to route power, isolate, and support the power electronic system components. Thus, in the illustrated embodiment, front component support/isolation layer 50 is disposed over the front support 48, and serves to support additional conductors 52 used to route power to and from the power electronic components. The layer 50 will include series of apertures in a manner similar to those described above for layers 36 and 40, serves to permit routing of a coolant and any fasteners or conductors therethrough. Conductors 52 may extend in the same direction as conductors 42 or in different directions, depending upon the layout of the power electronic system components.

Additional isolation layers may be provided over the conductors, or components supports may be provided directly over the conductors and mounted to support/isolation layer 50 as in the illustrated embodiment. In particular, a component support 54 is illustrated in FIG. 4 to provide mechanical support for the upper component 18 as illustrated. Also as illustrated in FIG. 4, to accommodate the different sections of the power electronic system, as described above, multiple separate support/isolation layer elements may be provided, such as upper and lower elements for the different sections. It should be noted that in the same manner, layers 36 and 40 may be separated into multiple layers, depending upon the layout of the system, support and isolation needs, and so forth. Additional conductors may be provided for routing power directly to and from the individual components 18. As described more fully below, direct plug-in connections may be provided, or individual conductors, such as represented at reference numeral 56 in FIG. 4, may be electrically connected between the conductors 52 and/or 42 and the components.

An important aspect of the present technique is the highly flexible and adaptable nature of the overall system approach. That is, many system configurations may be envisaged, and may be accommodated by the various layers of the power backplane system 10, the conductors provided, the locations of the conductors, and their mechanical and electrical support and interconnection. Essentially, the present technique provides and alternative to traditional enclosure-routed connections by means of the multi-layer, modular power backplane system.

Figure 5:
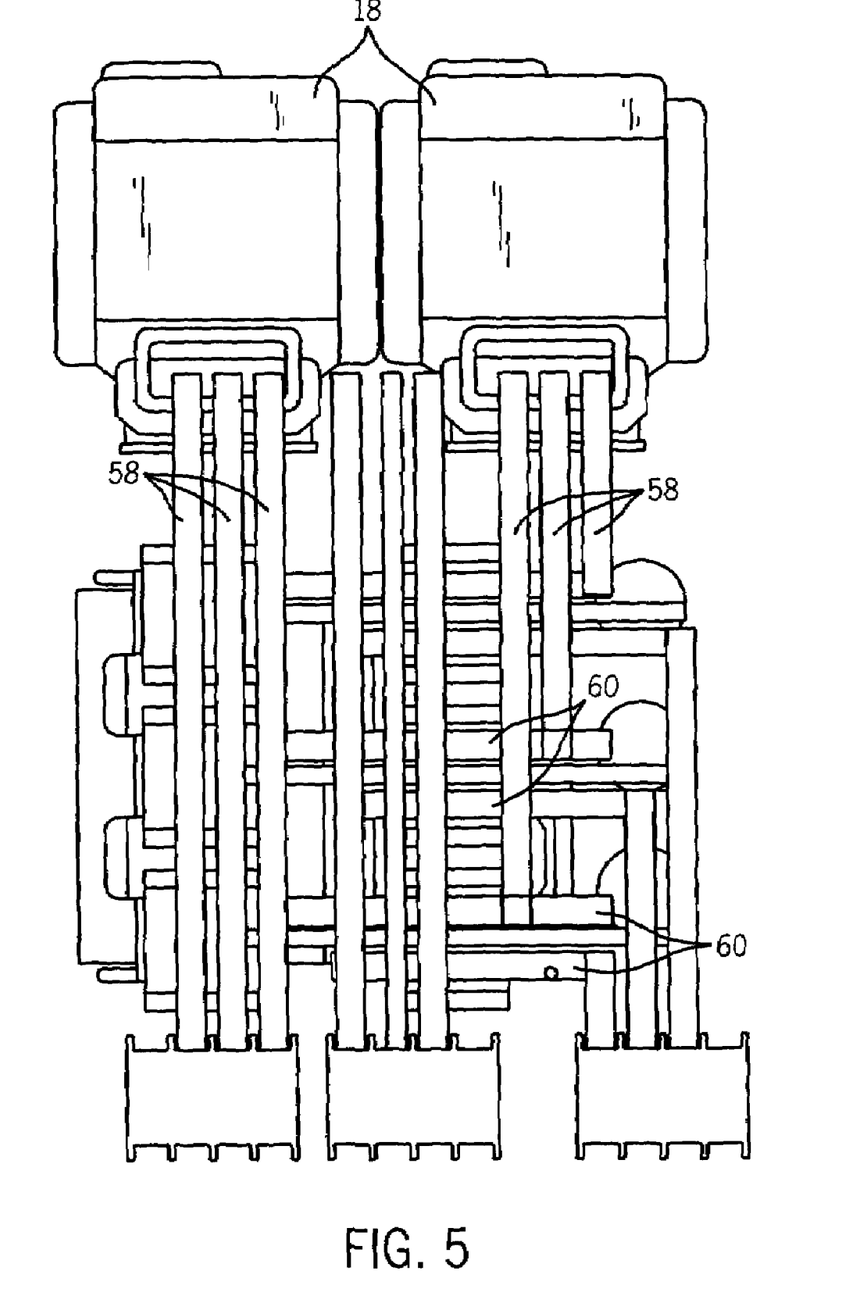
FIG. 5 is a rear elevational view of the exemplary components of FIG. 2 with support and isolation elements of the backplane removed to illustrate various types of electrical interconnection that are available via the present technique.

FIG. 5 generally illustrates, for the exemplary implementation described above, this type of flexibility. FIG. 5 is a rear elevational view of the implementation described above, with all coolant, support and isolation elements removed. That is, FIG. 5 represents only the components of the power electronic system, the terminal arrays, and the routing of the conductors in the various layers of the power backplane system to accommodate input and output power to and from the components, and interconnection of the components with one another. As shown in FIG. 5, power bus conductors 58 may be routed between the inputs and outputs in the various components. Such bus conductors may include three-phase power conductors of the same or different power ratings. Moreover, depending upon the nature of the power electronic system, the bus conductors may apply power to the components or may route power from the components to external circuitry. In the illustrated implementation, and as described more fully below, the vertical power bus conductors are routed behind the rear conductor support/isolation layer 40 shown in FIG. 4.

Interconnected with these power bus conductors 58 are what may be termed distribution conductors 60. These conductors serve to route power directly to and from the components of the power electronic system, by interconnection between the power bus conductors 58 and the components themselves, or additional conductors which lead directly to the components. In practical applications, distribution conductors 60 may be linked to the individual components by direct connection, by additional conductors, such as conductor 56 illustrated in FIG. 4, by cabling or conductive braids, or any other suitable conductive mechanism. This stacked structure, then, provides a very high degree of flexibility in the system design, and, in conjunction with the support/isolation layers, inherent isolation of the conductors from one another, and mechanical support for the conductors in the power backplane system.

With reference now to FIGS. 6–10, the exemplary implementation illustrated above is shown through successive removal of the system components from front and rear sides of the assembly. Again, it should borne in mind that the particular configuration described herein, and shown in FIGS. 6–10 is provided as an example only. Many different layouts and configurations may be made through application of the principles of the inventive technique.

Figure 6:
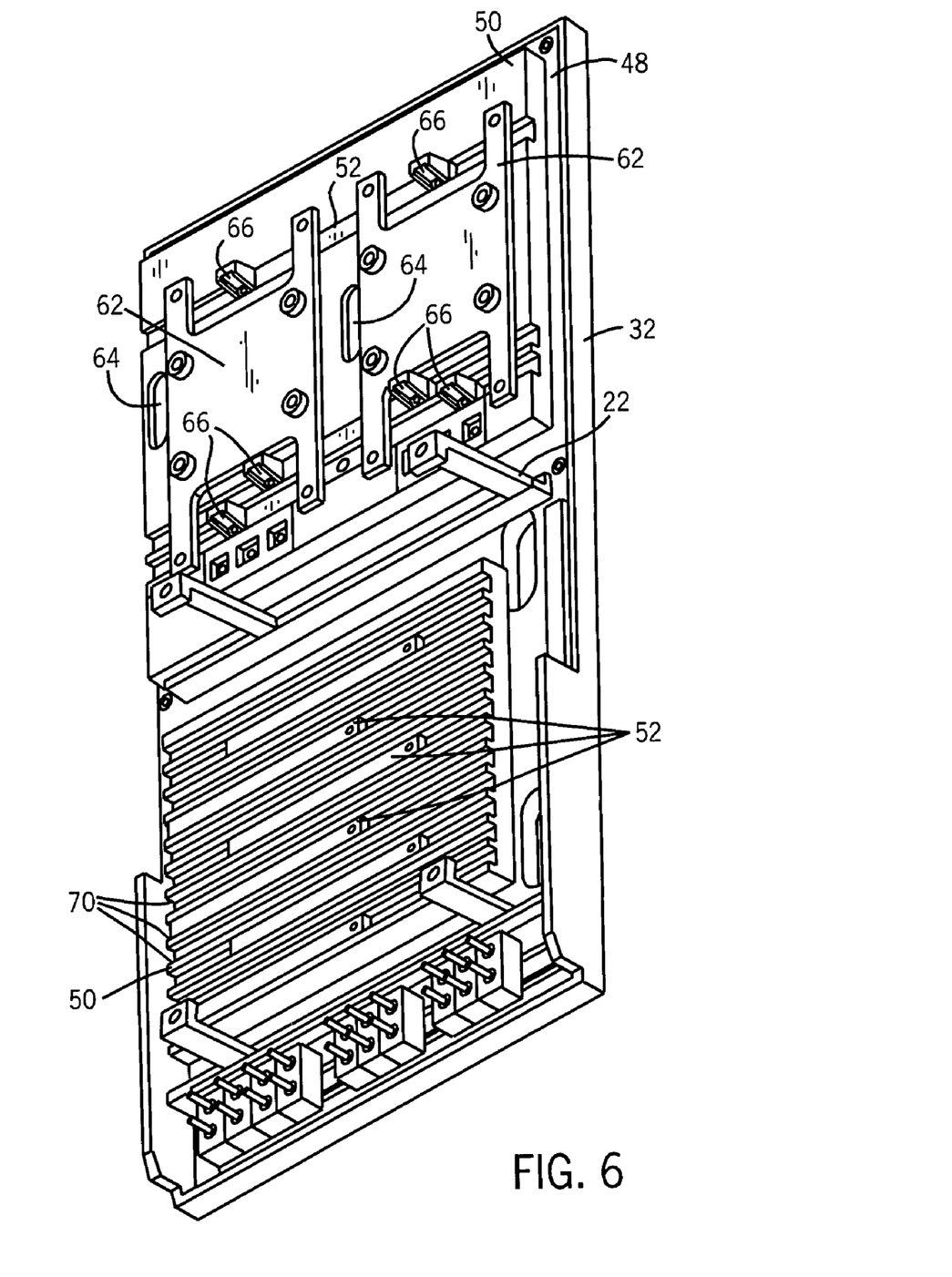
FIG. 6 is a tope perspective view of the backplane of the exemplary system of FIG. 2 with components removed to illustrate component mounting and interconnection structures, and certain electrical interconnection components.

Referring specifically to FIG. 6, the power backplane system 10 is shown following removal of the power electronic components 18 shown in the previous figures (see, e.g., FIG. 2). With the components removed, the front component support/isolation layer 50 may be seen. As noted above, in the exemplary embodiment shown, two separate layer elements are provided to accommodate the two separate sections of the power electronic system. The front support 48 is seen behind the front component support/isolation layer 50, and may include integral fasteners, such as tapped inserts, or simple apertures to accommodate such fasteners, to allow for mechanical support of the power backplane system, enclosures 14 (see, e.g. FIG. 1), and to allow for securement of the front support 48 to the rear support 32. As also shown in FIG. 6, individual component supports 62 are mounted on the front component support/isolation layer 50 to allow the individual components to be mechanically supported thereon for interconnection with coolant conduits and electrical circuitry. Specifically-designed and located apertures 64 may be seen in FIG. 6, for accommodating passage of fluid conduits (not shown in FIG. 6) to and from the individual components. Additionally, such apertures are provided, where necessary, for interconnection with the conductors that lie on a front face of the support/isolation layer 50 or behind layer 50. Additional elements of the backplane system may include plug-in connectors 66 to allow for ready engagement of the power electronic systems with either power or data circuits or both.

As may also be seen in FIG. 6, the front component support/isolation layer 50 may define grooves or other support features to support and isolate conductors 52 that are disposed thereon, as represented generally at reference numeral 70 in FIG. 6. The isolation layer 50, and the other isolation layers, may be made of any suitable material, such as glass-filled ABS, synthetic plastic isolation materials, paper and impregnated paper layers, and so forth. The support features, such as grooves 70, may be routed in one or multiple directions, and may be formed in layer 50 by machining (e.g. milling), molding, or in any other suitable fashion. Similarly, the layer 50 itself may be a composite structure of various assembled elements to provide the desired mechanical support and electrical isolation. In certain embodiments, particularly where location and mechanical support of the conductors is not required of the isolation layers, these layers may be made of a sheet of insulating material, such as spun fiber material commercially available from E.I. du Pont de Nemours and Company under the registered trademark Nomex.

Figure 7:
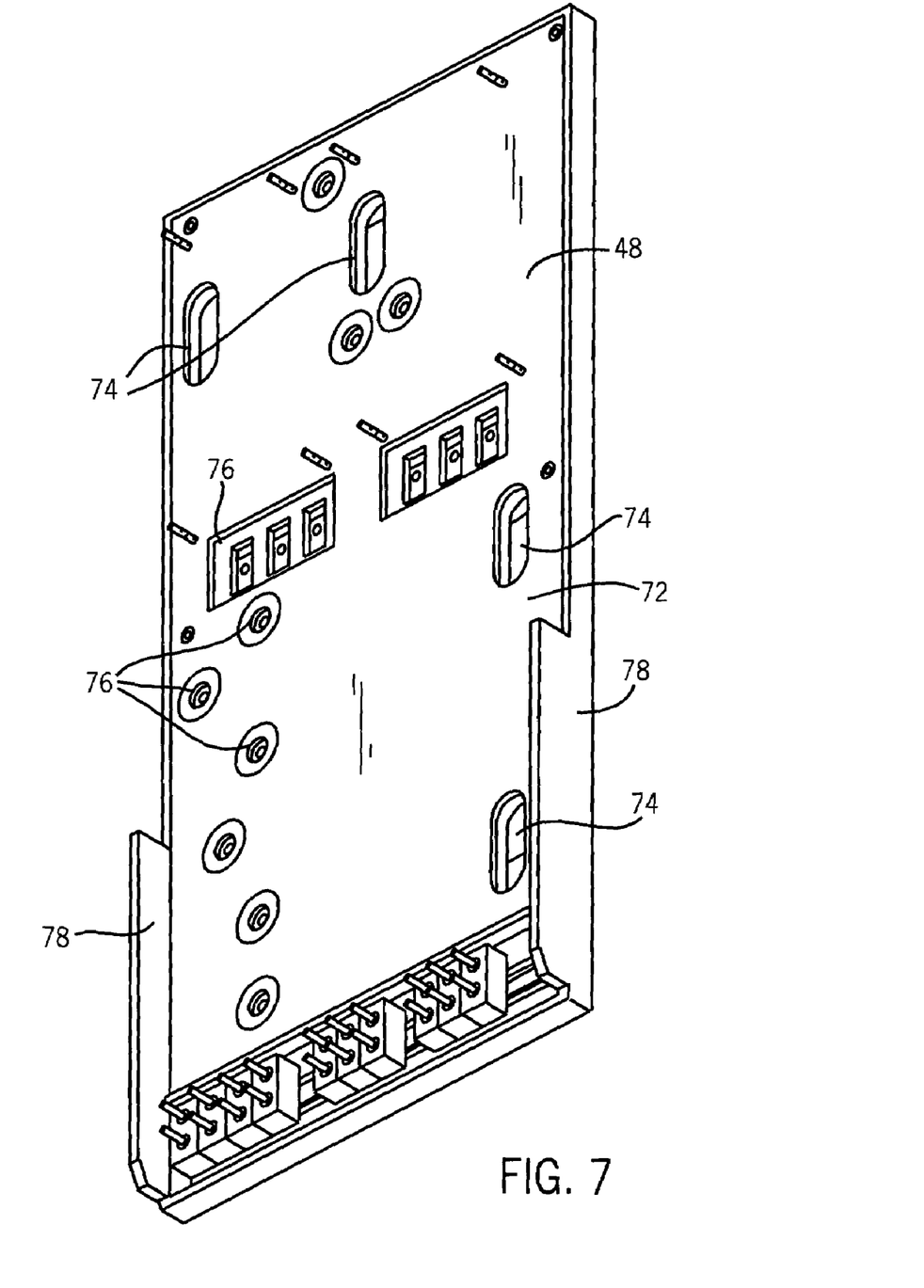
FIG. 7 is a top perspective view of the system of FIG. 6, in which the component mounting structures and isolation structures have been removed from the backplane.

FIG. 7 shows a similar perspective view of the backplane system 10 but wherein the component supports 62 and front component support/isolation layer 50 have been removed to expose the front support 48. As noted above, support 48, in the illustrated embodiment, is made of a metal plate or other mechanically rigid assembly which supports the components secured thereto. The support generally forms a panel 72 through which coolant conduit apertures 74 are formed. Other apertures 76 accommodate access to conductors below or behind the panel 72. Clearly, additional apertures, fasteners, inserts, and so forth may be provided in the panel or through the panel to accommodate mounting of the various structures of the power backplane system. Further, support or rigidity-lending structures such as flanges 78 may be formed on or around the panel to better house and structurally support the components.

Figure 8:
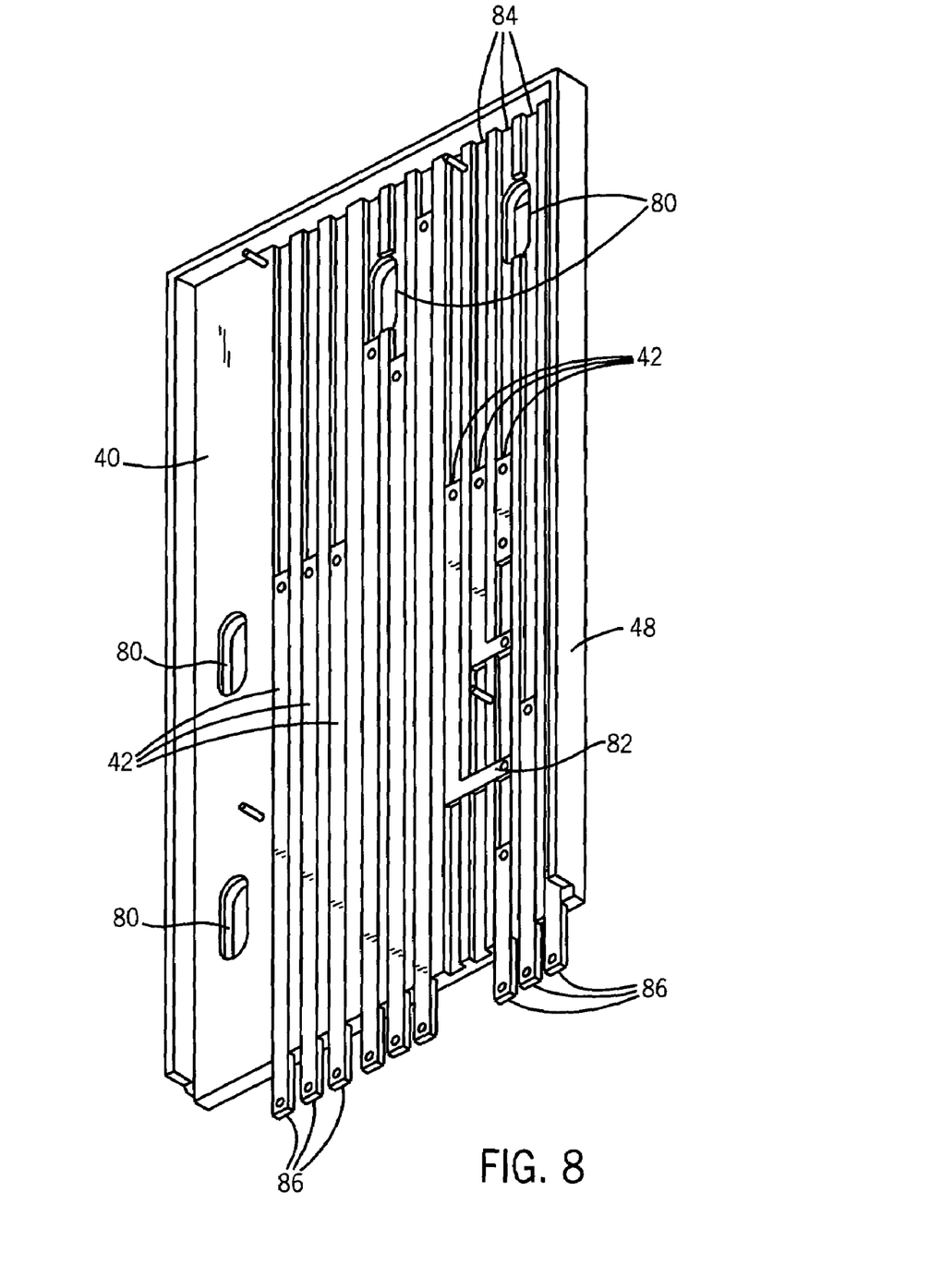
FIG. 8 is a top perspective view of a rear side of a conductor support used in the exemplary backplane system behind the support structure shown in FIG. 7.

Continuing to FIG. 8, the rear side of front support 48 shown in FIG. 7 houses the rear conductor support/isolation layer 40 shown in FIG. 8. FIG. 8, then, represents a view from the rear of layer 40 with front support 48 seen behind layer 40. As with front component support/isolation layer 50 (see FIG. 6), layer 40 may be comprised of any suitable type of material, such as a mechanically supporting and electrically insulative material. Again, where mechanical support is not required, layer 40 may include simply an electrically insulating sheet. The layer 40 includes a series of coolant conduit apertures 80 to permit passage of coolant conduits therethrough, as well as conductor apertures 82 to permit access to conductors 42 which are routed on the rear face of layer 40. It should be noted that, as mentioned above with reference to layer 50, layer 40 may, in certain applications, include multiple layers of insolating material, or assemblies of insolating material with a single or multiple layers of conductors. In the embodiment illustrated in FIG. 8, a single layer of insulative material is provided with a correspondingly single layer of conductors. The conductors each comprise a flat plate or strap which is laid into a routing groove 84 provided on the rear face of layer 40. As noted above, such grooves may be formed by machining operations, or may be preformed in the support/isolation layer 40. The particular form and routing of the conductors will depend upon the placement of the power needs of the various system components. In the embodiment illustrated in FIG. 8, for example, the conductors include extensions 86 which protrude beyond the lower edge of layer 40 to permit attachment of terminals (see, e.g. FIG. 2). As noted above, the conductors may be secured to layer 40 by any suitable means, such as via fasteners, rivets, soldering to other components, welding to other components, and so forth.

Figure 9:
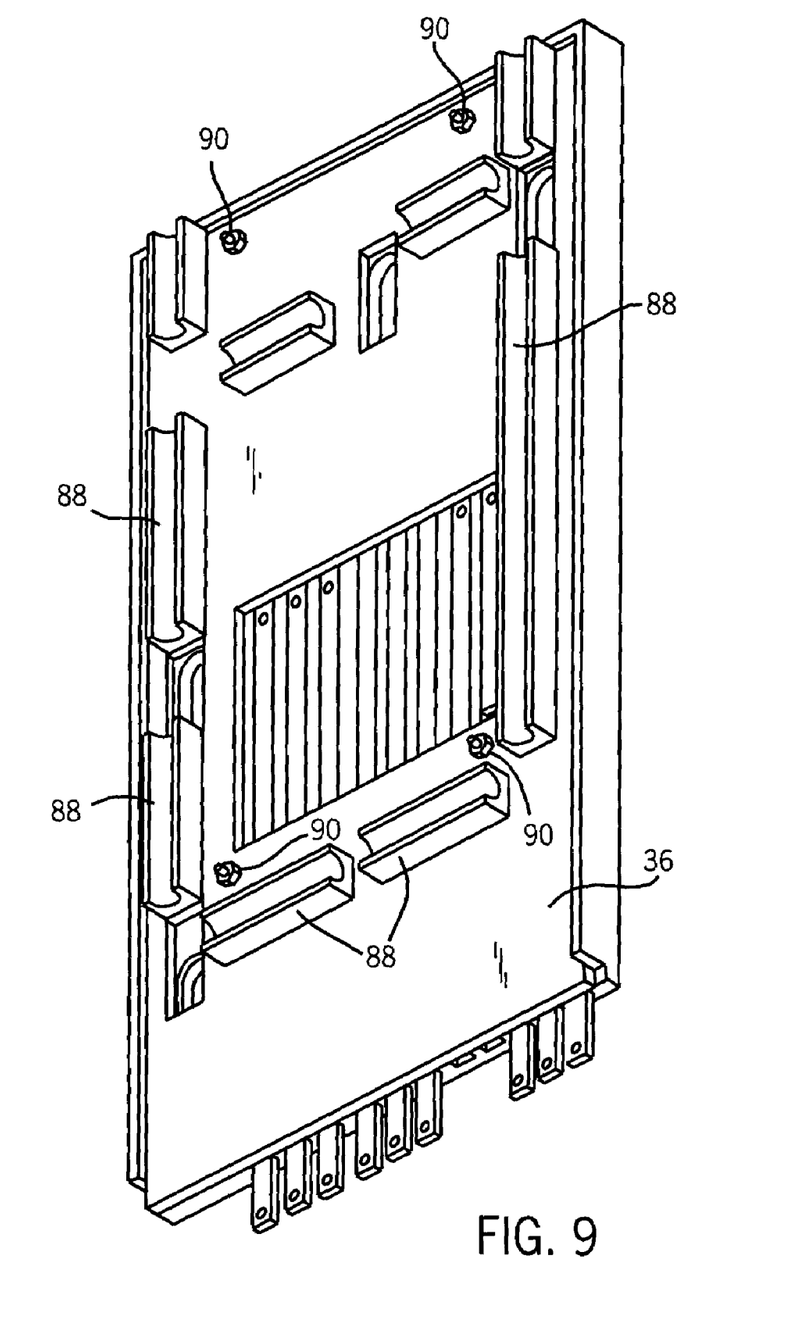
FIG. 9 is a top perspective view of the rear side of the backplane system of FIG. 8 in which a coolant system support structure has been added.

FIG. 9 illustrates the power backplane system 10 with the conduit support/isolation layer 36 being mounted over the rear conductor support/isolation layer and conductors 42 shown in FIG. 8. As with the other support/isolation layers, layer 36 may include a single panel of material which is machined or an assembly of elements which are assembled and associated with one another to perform the desired mechanical support and electrical isolation functions. Where appropriate, the layer may also comprise a simple insulating sheet. In the embodiment illustrated in FIG. 9, layer 36 includes conduit supports 88 which serve to route and mechanically support the conduits used to distribute coolant flow to and from the various components of the power electronic system. Accordingly, as noted above, apertures are provided through layer 36 to accommodate the conduits. As will be appreciated by those skilled in the art, fasteners 90 or other mechanical devices may be used to join layer 36 to other layers of the power backplane system and to hold all of the layers firmly in an assembly.

Figure 10:
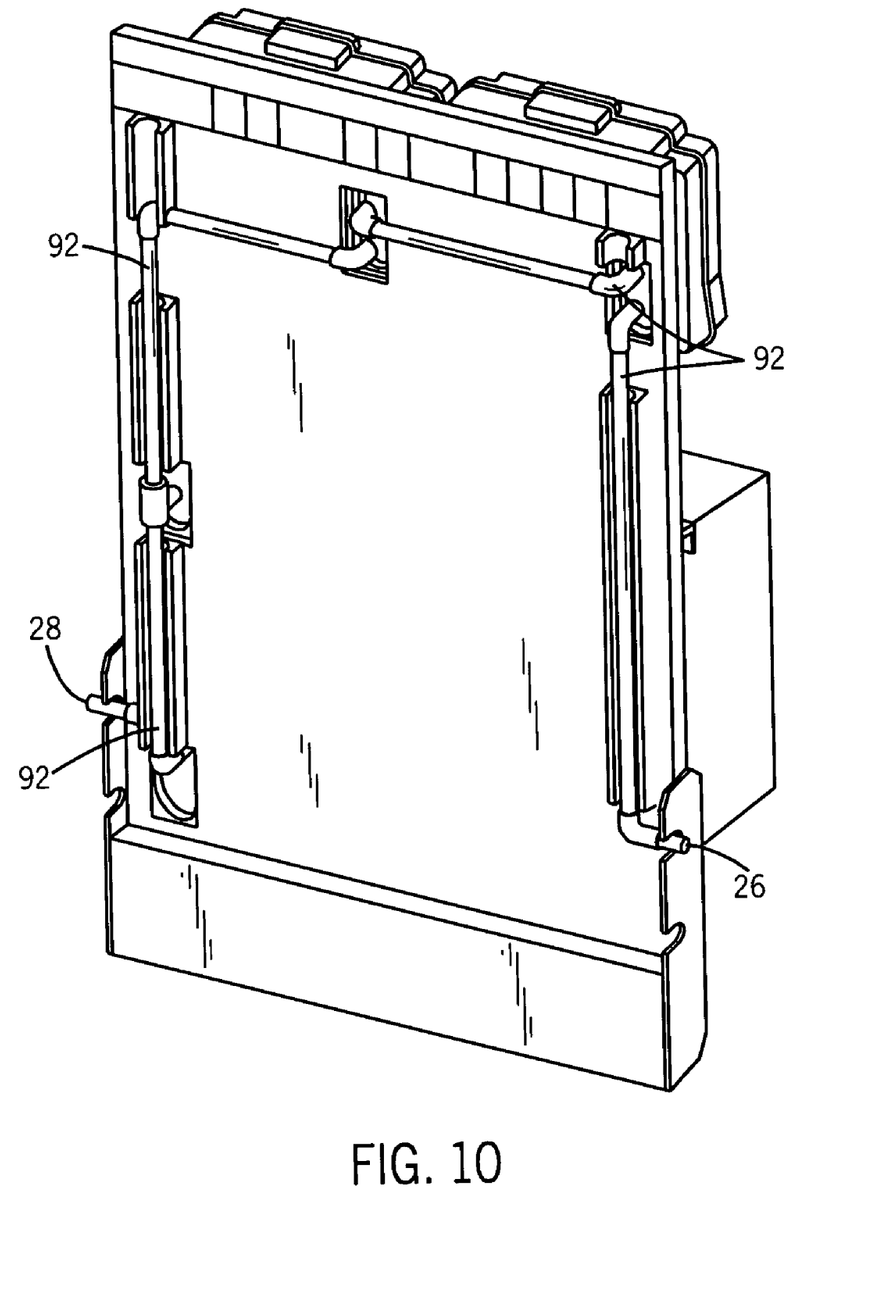
FIG. 10 is a top perspective view of the backplane system of FIG. 9, in which coolant conduits have been added onto the support structure.

FIG. 10 illustrates the rear of the power backplane system 10, with the rear support 32 removed for explanatory purposes. As may be seen in FIG. 10, the fluid conduits 92 used to route coolant to and from the various components are supported on the conduit support/isolation layer 36, and passed through the various layers to the serviced components. The conduits may be made of any suitable material, such as a conventional tubing, piping, manifolded conduits, hoses and flexible conduits, and so forth. As also noted above, an inlet 26 is provided, along with an outlet 28 for the coolant flow. The inlets and outlets may be provided at any suitable location, such as for a through-flow configuration as shown in FIG. 10, or along the same or multiple sides, edges or faces of the system.

The power backplane system described above facilitates mounting of the various system components, and routing of power and coolant in a very modular and flexible fashion. Moreover, necessary isolation of electrical conductors from one another is inherently provided by the layers of the system. Where desired, additional sealing, covers, isolation zones, and the like may be provided or defined in the system, depending upon the system requirements. Similarly, additional isolation and structural rigidity may be provided by filling one or more of the spaces in which the conductors are provided with various materials, such as fire stop materials which may be specified in various classes depending upon the application. Such materials may also offer a sealing function within one or more of the layers, or between layers.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims. For example, while single elements or layers are generally described in the illustrated embodiment, these "layers" may comprise multiple separate pieces that functionally serve as a layer from the standpoint of the backplane. Such separate pieces may, for example, facilitate conductor alignment, define the required mechanical supports, define insulators and insulation layers, and so forth. Similarly, while coolant conduits have been described in the exemplary embodiment, various types of manifolds may be employed as well, to aid in routing coolant into the assembly, to and from components, and to facilitate sealing of the coolant flow paths. Moreover, the locations of the various connections may be freely changed from those discussed above. For example, in certain arrangements, it may be preferable to provide liquid coolant connections physically below electrical connections to avoid the potential for leakage or drippage on the electrical connections.

What is claimed is:

1. A power backplane system for routing power to and from an electrical power component, the system comprising:
    a mechanical support panel;
    a first power routing layer including a plurality of bus conductors extending generally parallel to the support panel and a first isolating layer for insulating the bus conductors from other elements of the system;
    a second power routing layer disposed over the first power routing layer and including a plurality of distribution conductors electrically connected to the bus conductors and a second isolating layer for insulating the distribution conductors from other elements of the system, the distribution conductors being configured to be electrically coupled to the electrical power component; and
    a component support layer disposed over the second power routing layer and including at least one mechanical support for the electrical power component, the component support layer including passages for electrically coupling the electrical power component to the distribution conductors, the component support layer being mechanically secured to the mechanical support panel to at least partially enclose the first and second power routing layers therebetween.

2. The power backplane system of claim 1, further comprising a coolant layer configured to receive and circulate a flow of coolant and to route the coolant to the electrical power component for cooling the component during operation.

3. The power backplane system of claim 1, wherein at least one of the isolating layers includes mechanical supports for at least one of the bus conductors or the distribution conductors.

4. The power backplane system of claim 1, comprising a mounting panel secured to the mechanical support panel, wherein the first and second conductor layers are disposed between the mounting panel and the mechanical support panel.

5. The power backplane system of claim 1, wherein the bus conductors include extensions to at least one edge of the first conductor support layer, and wherein the extensions are coupled to terminals for electrical connection to external circuitry.

6. The power backplane system of claim 1, wherein the bus and distribution conductors include conductors for conducting three phase electrical power to or from the component.

7. The power backplane system of claim 1, wherein the isolating layers include a sheet of insulating material disposed over the respective conductors.

8. The power backplane system of claim 2, wherein the coolant layer is disposed between the first power routing layer and the mechanical support panel.

9. The power backplane system of claim 2, wherein the coolant layer includes conduits for directing coolant flow to and from the component, and wherein the first and second power routing layers include passages through which the conduits extend.

10. A power backplane system for routing power to and from an electrical power component, the system comprising:
    a mechanical support panel;
    a coolant layer configured to receive and circulate a flow of coolant and to route the coolant to the electrical power component for cooling the component during operation;
    a first power routing layer including a plurality of bus conductors extending generally parallel to the support panel and a first isolating layer for insulating the bus conductors from other elements of the system;
    a second power routing layer disposed over the first power routing layer and including a plurality of distribution conductors electrically connected to the bus conductors and a second isolating layer for insulating the distribution conductors from other elements of the system, the distribution conductors being configured to be electrically coupled to the electrical power component; and a component support layer disposed over the second power routing layer and including at least one mechanical support for the electrical power component, the component support layer including passages for electrically coupling the electrical power component to the distribution conductors the component support layer being mechanically secured to the mechanical support panel to at least partially enclose the first and second power routing layers and the coolant layer therebetween.

11. The power backplane system of claim 10, wherein the coolant layer is disposed between the first power routing layer and the mechanical support panel.

12. The power backplane system of claim 10, wherein the coolant layer includes conduits for directing coolant flow to and from the component, and wherein the first and second power routing layers include passages through which the conduits extend.

13. The power backplane system of claim 10, wherein at least one of the isolating layers includes mechanical supports for at least one of the bus conductors or the distribution conductors.

14. The power backplane system of claim 10, comprising a mounting panel secured to the mechanical support panel, wherein the first and second conductor layers are disposed between the mounting panel and the mechanical support panel.

15. The power backplane system of claim 10, wherein the bus conductors include extensions to at least one edge of the first conductor support layer, and wherein the extensions are coupled to terminals for electrical connection to external circuitry.

16. The power backplane system of claim 10, wherein the bus and distribution conductors include conductors for conducting three phase electrical power to or from the component.

17. The power backplane system of claim 10, wherein the isolating layers include a sheet of insulating material disposed over the respective conductors.

18. An electrical system comprising:
   an electric power component configured to receive electrical power from a source and to transmit electrical power to an application; and
   a power backplane system configured to support the component and to apply electrical power to the component from the source and to transmit electrical power from the component to the application, the backplane system comprising:
   a mechanical support panel;
   a first power routing layer including a plurality of bus conductors extending generally parallel to the support panel for conducting power to and from the component, and a first isolating layer for insulating the bus conductors from other elements of the system;
   a second power routing layer disposed over the first power routing layer and including a plurality of distribution conductors electrically connected to the bus conductors for conducting power to and from the component, and a second isolating layer for insulating the distribution conductors from other elements of the system, the distribution conductors being configured to be electrically coupled to the electrical power component; and
   a component support layer disposed over the second power routing layer and including at least one mechanical support for the electrical power component, the component support layer including passages for electrically coupling the electrical power component to the distribution conductors, the component support layer being mechanically secured to the mechanical support panel to at least partially enclose the first and second power routing layers therebetween.

19. The system of claim 18, further comprising a coolant layer configured to receive and circulate a flow of coolant and to route the coolant to the electrical power component for cooling the component during operation.

20. The system of claim 18, wherein at least one of the isolating layers includes mechanical supports for at least one of the bus conductors or the distribution conductors.

21. The system of claim 18, comprising a mounting panel secured to the mechanical support panel, wherein the first and second conductor layers are disposed between the mounting panel and the mechanical support panel.

22. The system of claim 18, wherein the bus conductors include extensions to at least one edge of the first conductor support layer, and wherein the extensions are coupled to terminals for electrical connection to external circuitry.

23. The system of claim 18, wherein the bus and distribution conductors include conductors for conducting three phase electrical power to or from the component.

24. The system of claim 19, wherein the coolant layer is disposed between the first power routing layer and the mechanical support panel.

25. The system of claim 19, wherein the coolant layer includes conduits for directing coolant flow to and from the component, and wherein the first and second power routing layers include passages through which the conduits extend.

26. An electrical system comprising:
   an electric power component configured to receive electrical power from a source and to transmit electrical power to an application; and
   a power backplane system configured to support the component and to apply electrical power to the component from the source and to transmit electrical power from the component to the application, the backplane system comprising:
   a mechanical support panel;
   a coolant layer configured to receive and circulate a flow of coolant and to route the coolant to the electrical power component for cooling the component during operation;
   a first power routing layer including a plurality of bus conductors extending generally parallel to the support panel for conducting power to and from the component, and a first isolating layer for insulating the bus conductors from other elements of the system;
   a second power routing layer disposed over the first power routing layer and including a plurality of distribution conductors electrically connected to the bus conductors for conducting power to and from the component, and a second isolating layer for insulating the distribution conductors from other elements of the system, the distribution conductors being configured to be electrically coupled to the electrical power component; and
   a component support layer disposed over the second power routing layer and including at least one mechanical support for the electrical power component, the component support layer including passages for electrically coupling the electrical power component to the distribution conductors the component support layer being mechanically secured to the mechanical support panel to at least partially enclose the first and second power routing layers and the coolant layer therebetween.

27. The system of claim 26, wherein the coolant layer is disposed between the first power routing layer and the mechanical support panel.

28. The system of claim 26, wherein the coolant layer includes conduits for directing coolant flow to and from the component, and wherein the first and second power routing layers include passages through which the conduits extend.

29. The system of claim 26, wherein at least one of the isolating layers includes mechanical supports for at least one of the bus conductors or the distribution conductors.

30. The system of claim 26, comprising a mounting panel secured to the mechanical support panel, wherein the first and second conductor layers are disposed between the mounting panel and the mechanical support panel.

31. The system of claim 26, wherein the bus conductors include extensions to at least one edge of the first conductor support layer, and wherein the extensions are coupled to terminals for electrical connection to external circuitry.

32. The system of claim 26, wherein the bus and distribution conductors include conductors for conducting three phase electrical power to or from the component.

33. The system of claim 26, wherein the isolating layers include a sheet of insulating material disposed over the respective conductors.

34. A method for routing power to and from an electrical power component, the system comprising:
    providing a mechanical support panel;
    providing a first power routing layer supported in the support panel, the first power routing layer including a plurality of bus conductors extending generally parallel to the support panel and a first isolating layer for insulating the bus conductors from other elements of the system;
    providing a second power routing layer disposed over the first power routing layer and including a plurality of distribution conductors electrically connected to the bus conductors and a second isolating layer for insulating the distribution conductors from other elements of the system, the distribution conductors being configured to be electrically coupled to the electrical power component;
    providing a component support layer disposed over the second power routing layer and including at least one mechanical support for the electrical power component, the component support layer including passages for electrically coupling the electrical power component to the distribution conductors; and
    mechanically securing the component support layer to the mechanical support panel to at least partially enclose the first and second power routing layers therebetween.

35. The method of claim 1, further comprising providing a coolant layer configured to receive and circulate a flow of coolant and to route the coolant to the electrical power component for cooling the component during operation.

* * * * *